United States Patent
Yang

(10) Patent No.: US 6,704,911 B2
(45) Date of Patent: Mar. 9, 2004

(54) RC NETLIST REDUCTION FOR TIMING AND NOISE ANALYSIS

(75) Inventor: Xiao-Dong Yang, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 17 days.

(21) Appl. No.: 10/034,591

(22) Filed: Dec. 28, 2001

(65) Prior Publication Data

US 2003/0126575 A1 Jul. 3, 2003

(51) Int. Cl.⁷ .............................................. G06F 17/10
(52) U.S. Cl. .................................. 716/2; 716/6
(58) Field of Search .............................. 716/2, 4, 5, 6

(56) References Cited

U.S. PATENT DOCUMENTS 6,014,510 A    1/2000  Burks et al. ............. 395/500.4

OTHER PUBLICATIONS

Sheehan, Bernard, et al., "TICER: Realizable reduction of extracted RC circuits", 1999, IEEE, pp. 1–4.*

Mentor Grpahics, Bernard, et al., "TICER: Realizable reduction of extracted RC circuits", 1999, http://www.mentor.com.com/, pgs.*

Mauss, Jakob, et al., "Qualitative resoning about electrical circuits using series–parallel–star trees", 1996, www9.in.turn.de/personen/mauss/publications/MaussNeumann96a.pdf, pp. 1–13.*

Ajluni, Cheryl, "Parasitic extraction tools aid DSM IC designs", 1997, www.elecdesign.com/Globals/PlanetEE/Content/827.html, pp. 1–11.*

* cited by examiner

Primary Examiner—Stacy A. Whitmore
(74) Attorney, Agent, or Firm—Rosenthal & Osha L.L.P.

(57) ABSTRACT

A circuit reduction method that generates a netlist that maintains a topology of an original circuit while preserving an original circuit's functions and characteristics is provided. Further, a circuit reduction method that allows a user to selectively determine which nodes of an original circuit to reduce is provided. Further, a circuit reduction tool that is capable of removing loops that are not present in an original circuit but are present in an extraction of the original circuit is provided.

18 Claims, 7 Drawing Sheets

ORIGINAL CIRCUIT

TABLE 1. Resistance

| Ra1 | Ra2 | Ra3 | Rb1 | Rb2 | Rb3 |
|-----|-----|-----|-----|-----|-----|
| 10Ω | 20Ω | 30Ω | 30Ω | 20Ω | 10Ω |

TABLE 2. Ground Capacitance

| Cga1 | Cga2 | Cga3 | Cga4 | Cgb1 | Cgb2 | Cgb3 | Cgb4 |
|------|------|------|------|------|------|------|------|
| 10fF | 20fF | 30fF | 40fF | 40fF | 30fF | 20fF | 10fF |

TABLE 3. Coupling Capacitance

| Cc_ab1 | Cc_ab2 | Cc_ab3 | Cc_ab4 |
|--------|--------|--------|--------|
| 20fF   | 40fF   | 60fF   | 80fF   |

TRADITIONAL REDUCED CIRCUIT

TABLE 4. Resistance of PI Model

| Ra | Rb |
|---|---|
| 60Ω | 60Ω |

TABLE 5. Ground Capacitance of PI Model

| Cga1 | Cga2 | Cgb1 | Cgb2 |
|---|---|---|---|
| 50fF | 50fF | 50fF | 50fF |

TABLE 6. Coupling Capacitance of PI Model

| Cc1 | Cc2 |
|---|---|
| 100fF | 100fF |

NEW REDUCED CIRCUIT

TABLE 7. Resistance of reduced circuit

| Ra | Rab |
|---|---|
| 60Ω | 60Ω |

TABLE 8. Ground Capacitance of reduced circuit

| Cga1 | Cga2 | Cgb1 | Cgb2 |
|---|---|---|---|
| 41.667fF | 58.333fF | 58.333fF | 41.667fF |

TABLE 9. Coupling Capacitance of reduced circuit

| Cc1 | Cc2 | Cc3 | Cc4 |
|---|---|---|---|
| 41.667fF | 41.667fF | 8.333fF | 108.333fF |

RC NETLIST REDUCTION FOR TIMING AND NOISE ANALYSIS

BACKGROUND OF INVENTION

The capabilities of modern integrated circuits ("ICs") continue to increase as technology improves. In order to increase the capabilities of an IC without increasing the size of the IC, sizes of devices on the IC must often be reduced to units of microns ($10^{-6}$). Circuit designs using devices having sizes measurable in microns are known and referred to as deep submicron ("DSM") designs.

A typical IC having a DSM design has tens of millions of devices. With this increased number of devices, there are more devices per unit area than a non-DSM design IC. To connect the devices to the IC substrate itself and with other circuit devices and components, physical wires, known as interconnect, form a network of connections on the IC. From a technical viewpoint, interconnect does not behave as a virtual or ideal wire. Instead, the interconnect acts similarly to a network of capacitances and resistors, which can dominate circuit behavior, particularly with regard to timing. FIG. 1 shows a section of interconnect (10) on a typical IC (12). The interconnect (10) have inherent resistances (not shown) and capacitances (14). The section of interconnect (10) shown in FIG. 1 is typically part of a larger network of interconnect known and referred to as a "RC network."

As the number of interconnect in a RC network increase with more devices per unit area on a DSM design IC, device performance, e.g., timing, signal integrity, power problems, etc., coupled with the demands for increased reliability, speed, and efficiency becomes increasingly harder to manage. In order to meet such demands, chip designers use automated tools to verify physical design and ensure circuit integrity.

One method used to facilitate the analysis and testing of an IC's interconnect is parasitic extraction. Parasitic extraction is the process of creating an electrical model representation of the physical connections present between devices in an IC. The electrical model formed as a result of parasitic extraction is typically known and referred to as a "netlist."

Reduction entails removing unintentional circuit elements to ensure circuit integrity. One goal of typical reduction techniques is to make a netlist as compact as possible while preserving accuracy as much as possible.

FIGS. 2a and 2b respectively show an original circuit (20) before a typical reduction process and a reduced circuit (30) after the typical reduction process. As shown in FIG. 2b, a topology of the reduced circuit (30) is different from a topology of the original circuit (20). Further, the reduced circuit (30) has resistive loops (32) that were not present in the original circuit (20). Further still, the reduced circuit (30) has ground resistances (34) that were not present in the original circuit (20).

In effect, the typical reduction process results in a netlist that is topologically and functionally different from an original circuit. In addition, with a typical reduction process, because modern circuits have large numbers of input/output ports, there is a tendency for the reduction process to couple input/output ports with each other; thereby actually increasing the size of the circuit. Thus, there is a need for a reduction process that maintains an original circuit's topology while maintaining functional accuracy in a netlist with respect to the function and characteristics of the original circuit.

SUMMARY OF INVENTION

According to one aspect of the present invention, a circuit reduction method comprises inputting information about an original circuit structure, using a resistive degree of at least one node in the original circuit structure to selectively sort the at least one node, determining at least one time constant of the original circuit, sorting the at least one time constant, and determining whether to remove a loop in the original circuit structure based on the sorted at least one time constant and the sorted at least one node.

According to another aspect, a computer-readable medium having recorded therein instructions executable by processing, where the instructions are for: inputting information about an original circuit structure; using a resistive degree of at least one node in the original circuit structure to selectively sort the at least one node; determining at least one time constant of the original circuit; sorting the at least one time constant; and determining whether to remove a loop in the original circuit structure based on the sorted at least one time constant and the sorted at least one node.

According to another aspect, a computer system comprises a processor, a memory, and instructions that reside in the memory and are executable by the processor, where the instructions are for: inputting information about an original circuit structure; using a resistive degree of at least one node in the original circuit structure to selectively sort the at least one node; determining at least one time constant of the original circuit; sorting the at least one time constant; and determining whether to remove a loop in the original circuit structure based on the sorted at least one time constant and the sorted at least one node.

Other aspects and advantages of the invention will be apparent from the following description and the appended claims.

DETAILED DESCRIPTION

Embodiments of the present invention relate to a method and apparatus for generating a netlist that maintains a topology of an original circuit while preserving an original circuit's functions and characteristics. Embodiments of the present invention further relate to a method and apparatus for reducing a circuit using a process that maintains both (1) an original circuit topology and (2) functional characteristics of the original circuit.

Figure 1:
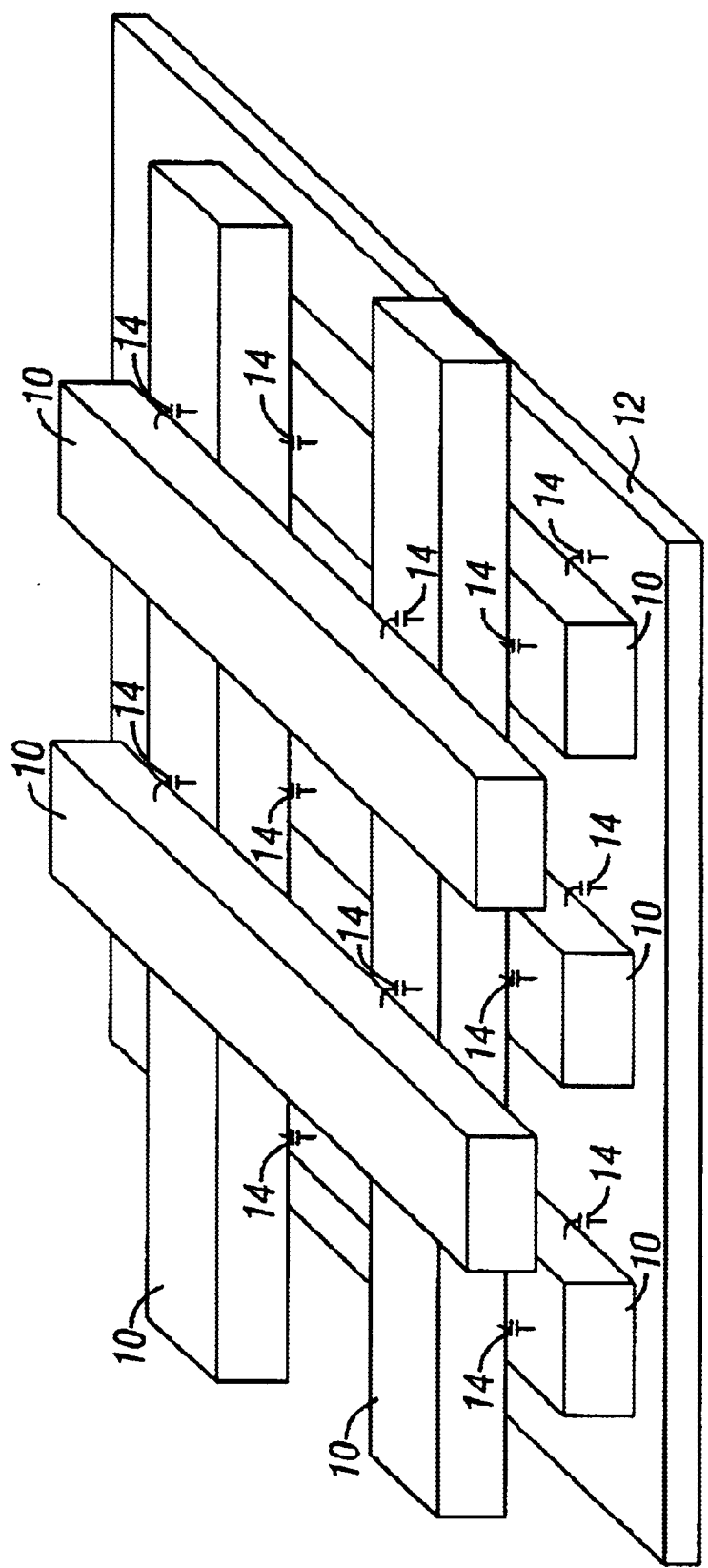
FIG. 1 shows a network of interconnects on a typical computer chip.
Figure 2A:
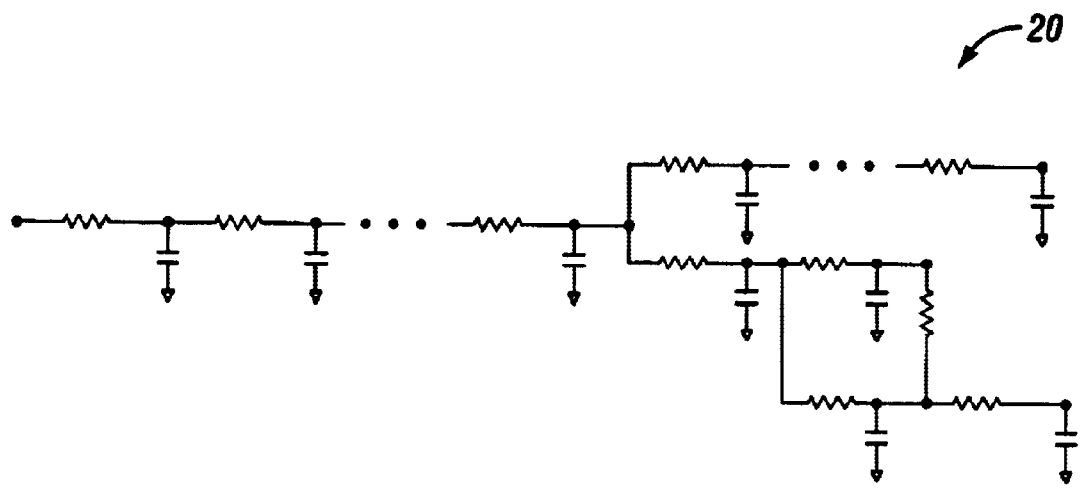
FIGS. 2a and 2b respectively show a circuit before and after a typical reduction process.
Figure 2B:
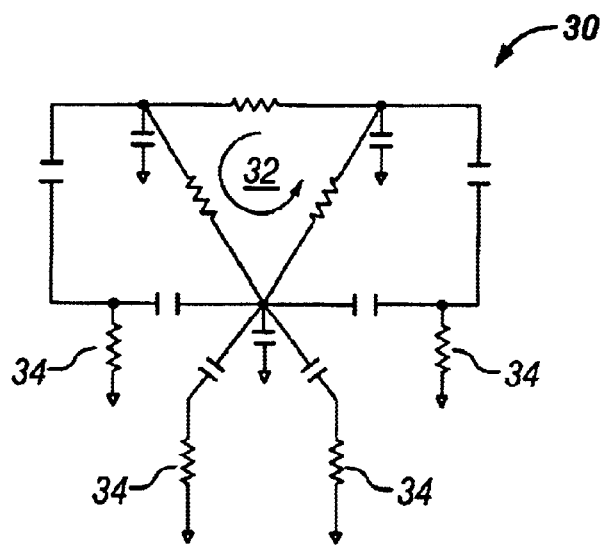
Figure 3:
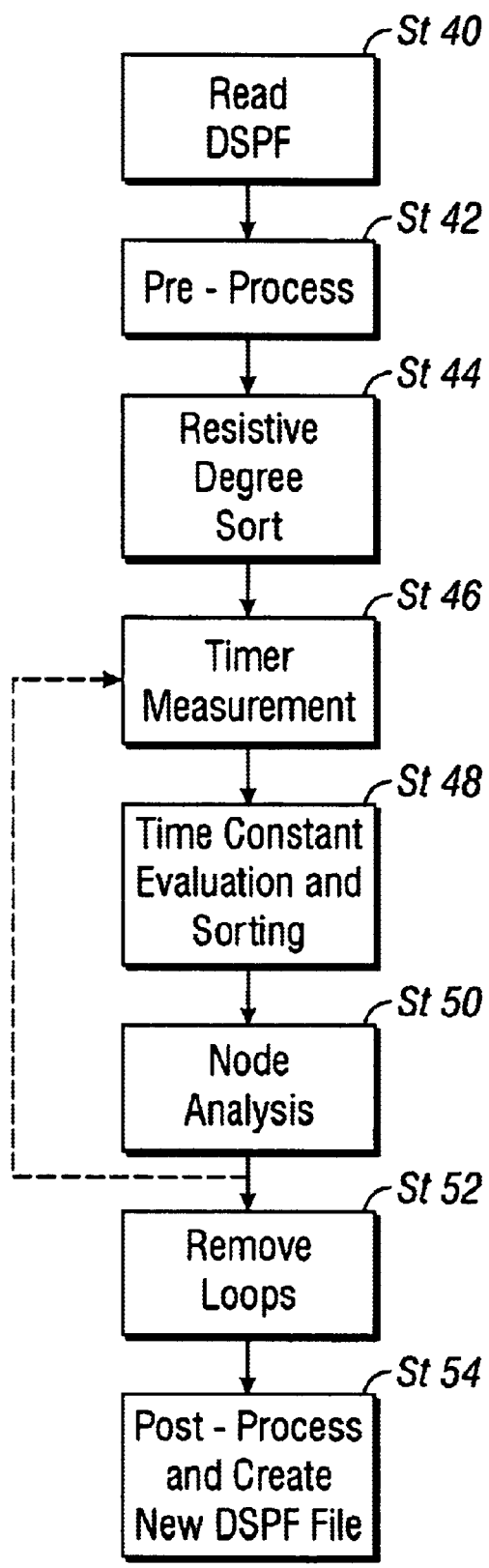
FIG. 3 shows a flow process in accordance with an embodiment of the present invention.

FIG. 3 shows an exemplary flow process in accordance with an embodiment of the present invention. Initially, a detailed standard parasitic format ("DSPF") is read (step 40). The DSPF has information regarding a structure of an original circuit. Once the DSPF has been read (step 40), a preprocessing phase occurs (step 42). The preprocessing phase involves preparing the original circuit such that it can be reduced. Thereafter, one or more nodes of the original circuit are sorted based on resistive degrees of the one or more modes (step 44).

Then, a timer is used to measure one or more time constants of the original circuit (step 46). Once the time constants have been determined (step 46), the time constants are evaluated and sorted (step 48). Using the evaluated and sorted time constant information, one or nodes in the original circuit are analyzed (step 50) in order to determine which loops of the original circuit to eliminate (step 52). Once one or more loops are eliminated from the original circuit, a time measurement may again be made (step 46) to determine one or more time constants of the modified circuit. After the loops are removed (step 54), a reduced circuit results, where after, the reduced circuit is post-processed and stored in a new DSPF file (step 56).

Figure 4A:
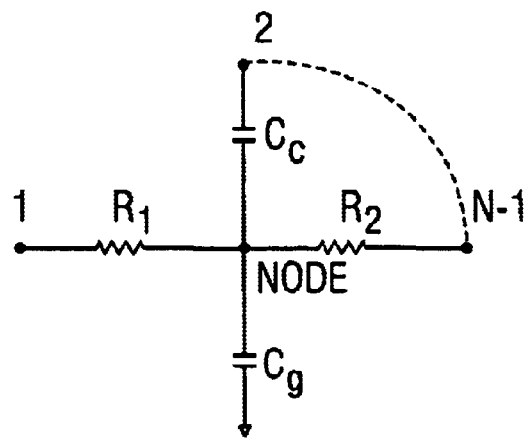
FIG. 4a shows a circuit for a reduction process in accordance with an embodiment of the present invention.

FIG. 4*a* shows a circuit for a reduction process in accordance with an embodiment of the present invention. Particularly, FIG. 4*a* shows a model of a node. In the reduction process, resistances and ground capacitances are redistributed by eliminating nodes with insignificant characteristic time constants based on local circuit transformation in order to keep an Elmore time constant from all directions. The characteristic time constant of a node is defined as:

$$\tau_C = \chi/\gamma = \Sigma C / \Sigma g, \quad (1)$$

where $\chi = \Sigma C$ represents the total capacitance (including $C_c$ and $C_g$) connected to a central node, and $\gamma = \Sigma g$ represents the total conductance connected to the central node. Further, $\tau_C$ is a measure of the significance of a node.

Those skilled in the art will appreciate that the elimination of insignificant nodes, there is only a relatively small effect in the time domain response. The critical time constant is determined by using a built-in fast delay and noise estimation engine to control the reduction process.

Still referring to FIG. 4*a*, if $R_{iN}$ and $R_{jN}$ are present, then connect node i and node j with $R_{ij}$, where $R_{ij} = \gamma_N/(g_{iN}*g_{jN})$. If $R_{iN}$ and $C_{jN}$ are present, then connect node i and node j with $C_{ij}$, where $C_{ij} = (g_{iN}*C_{jN})/\gamma_N$.

Figure 4B:
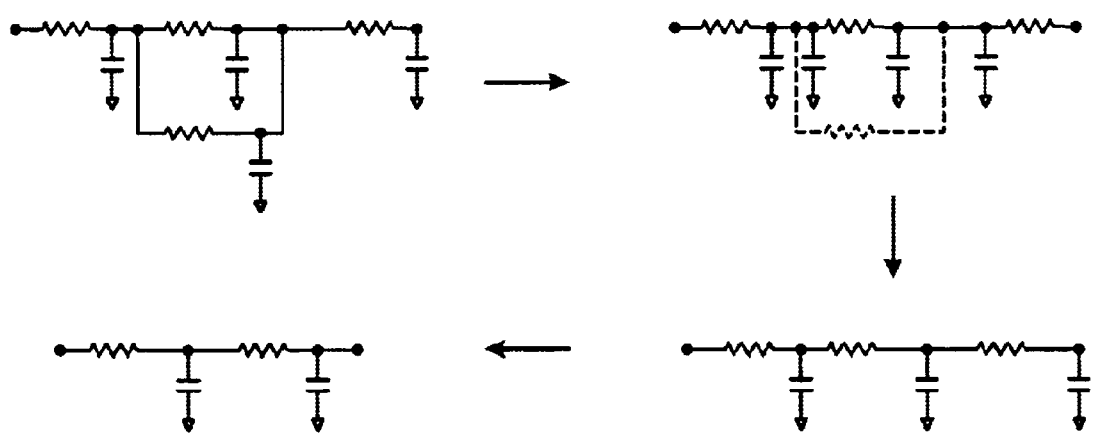
FIG. 4b shows a circuit reduction process in accordance with an embodiment of the present invention.

FIG. 4*b* shows an exemplary circuit reduction process in accordance with an embodiment of the present invention. Particularly, the reduction process shows the steps in a circuit transformation according to values for $R_{iN}$, $R_{jN}$, $\gamma_N$, and $C_{ij}$.

Figure 5A:
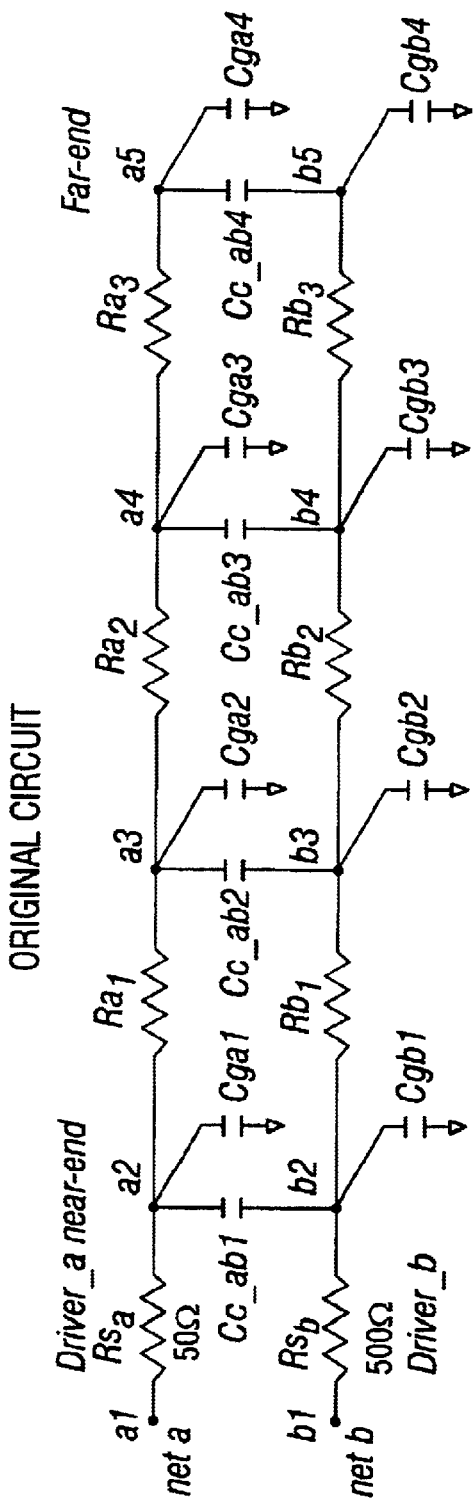
FIGS. 5a–5c show a circuit reduction process in accordance with another embodiment of the present invention.
Figure 5B:
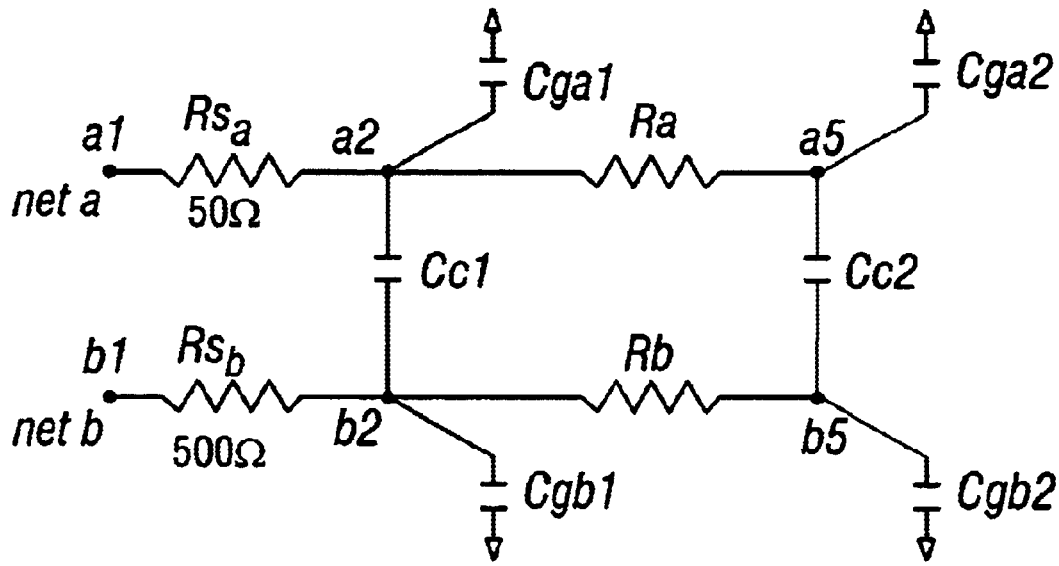
Figure 5C:
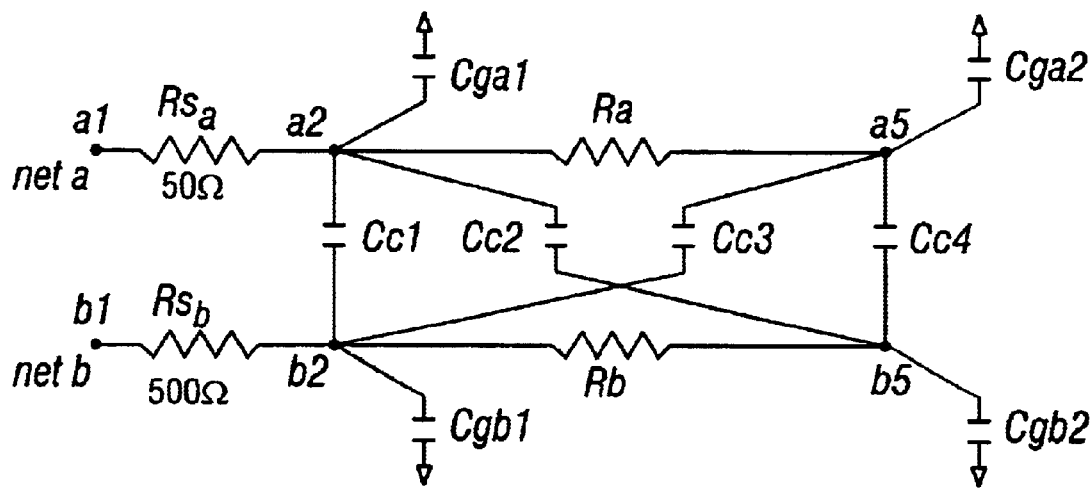

FIGS. 5*a*–5*c* show an original circuit, a circuit reduced using traditional means, and a circuit reduced in accordance with embodiments of the present invention.

Those skilled in the art will appreciate that a circuit reduction method in accordance with embodiments of the present invention maintain global ground capacitance distribution along a particular net. Further, those skilled in the art will appreciate that the circuit reduction method maintains the global coupling capacitance distribution along a particular net. Those skilled in the art will also appreciate that the circuit reduction method maintains spatial latency, i.e., the coupling between a near end node and a far end node.

Additionally, those skilled in the art will appreciate that a reduction tool related to the present invention allows a user to select a node for reduction.

Furthermore, those skilled in the art will appreciate that a reduction tool related to the present invention reduces an original circuit regardless of the number of input/output ports in the original circuit. Thus, unlike the typical reduction tool, the present invention compensates for input/output port linkages and ensures actual reduction, i.e., an actual decrease in circuit size.

Advantages of the present invention may include one or more of the following. In some embodiments, a reduced circuit may be generated that has a similar topology of an original circuit.

In some embodiments, because a circuit reduction method maintains coupling capacitance distribution along a net, accuracy is increased relative to when the coupling capacitance distribution along the net is not uniform.

In some embodiments, a reduced circuit may be generated that maintains the total ground capacitance present in an original circuit.

In some embodiments, a reduced circuit may be generated that maintains the total resistance of an original circuit.

In some embodiments, a reduced circuit may be generated that removes loops present in an original circuit.

In some embodiments, a circuit reduction tool reduces a size of an original circuit regardless of the amount and positions of input/output ports in the original circuit.

In some embodiments, a circuit reduction method has error control by which a user may specify an amount of error that can be tolerated in the circuit reduction method.

In some embodiments, a circuit reduction tool is able to remove loops that are not present in an original circuit structure but are present after a reduction extraction of the original circuit.

In some embodiments, a circuit reduction tool allows a user to select which nodes to reduce.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A circuit reduction method, comprising:
   inputting information about an original circuit structure;
   selectively sorting at least one node in the original circuit structure dependent on a resistive degree of the at least one node;
   dependent on the selectively sorting, determining at least one time constant of the at least one node;
   sorting the at least one time constant; and
   maintaining the at least one time constant from substantially all directions of the at least one node by redistributing at least one of a resistance and a ground capacitance, wherein the redistributing comprises eliminating another node having an insignificant characteristic time constant based on a local circuit transformation.

2. The circuit reduction method of claim 1, further comprising preprocessing the original circuit structure.

3. The circuit reduction method of claim 1, further comprising selectively choosing the at least one node as a node to be reduced.

4. The circuit reduction method of claim 1, further comprising:
   determining another time constant of the original circuit after redistributing;
   sorting the another time constant; and
   determining whether to remove loop in the original circuit structure based on the sorted another time constant and the sorted at least one node.

5. The circuit reduction method of claim 1, further comprising removing a loop that is not present in the original circuit structure but is present in an extraction of the original circuit structure.

6. The circuit reduction method of claim 1, wherein the at least one node is an Elmore time constant.

7. A computer-readable medium having recorded therein instructions executable by processing, the instructions for:
   selectively sorting at least one node in the original circuit structure dependent on a resistive degree of the at least one node;
   dependent on the selectively sorting, determining at least one time constant of the at least one node; sorting the at least one time constant; and
   maintaining the at least one time constant from substantially all directions of the at least one node by redistributing at least one of a resistance and a around capacitance, wherein the redistributing comprises eliminating another node having an insignificant characteristic time constant based on a local circuit transformation.

8. The computer-readable medium of claim 7, further comprising preprocessing the original circuit structure.

9. The computer-readable medium of claim 7, further comprising selectively choosing the at least one node as a node to be reduced.

10. The computer readable medium of claim 7, further comprising:
    determining another time constant of the original circuit after redistributing;
    sorting the another time constant; and
    determining whether to remove loop in the original circuit structure based on the sorted another time constant and the sorted at least one node.

11. The computer-readable medium of claim 7, further comprising removing a loop that is not present in the original circuit structure but is present in an extraction of the original circuit structure.

12. The computer-readable medium of claim 7, wherein the at least one node is an Elmore time constant.

13. A computer system, comprising:
    a processor;
    a memory; and
    instructions, residing in the memory and executable by the processor, for:
       selectively sorting at least one node in the original circuit structure dependent on a resistive degree of the at least one node;
       dependent on the selectively sorting, determining at least one time constant of the at least one node;
       sorting the at least one time constant; and
       maintaining the at least one time constant from substantially all directions of the at least one node by redistributing at least one of a resistance and a ground capacitance. wherein the redistributing comprises eliminating another node having an insignificant characteristic time constant based on a local circuit transformation.

14. The computer system of claim 13, further comprising instructions for preprocessing the original circuit structure.

15. The computer system of claim 13, further comprising instructions for selectively choosing the at least one node as a node to be reduced.

16. The computer system of claim 13, further comprising instructions for:
    determining another time constant of the original circuit after redistributing;
    sorting the another time constant; and
    determining whether to remove loop in the original circuit structure based on the sorted another time constant and the sorted at least one node.

17. The computer system of claim 13, further comprising instructions for removing a loop that is not present in the original circuit structure but is present in an extraction of the original circuit structure.

18. The computer system of claim 13, wherein the at least one node is an Elmore time constant.

* * * * *

UNITED STATES PATENT AND TRADEMARK OFFICE
CERTIFICATE OF CORRECTION

PATENT NO. : 6,704,911 B2
DATED : March 9, 2004
INVENTOR(S) : Xiao-Dong Yang

It is certified that error appears in the above-identified patent and that said Letters Patent is hereby corrected as shown below:

Column 5,
Line 11, please replace "around" with -- ground --.

Column 6,
Line 12, please replace the period with a comma.

Signed and Sealed this

Twenty-third Day of November, 2004

JON W. DUDAS
*Director of the United States Patent and Trademark Office*